(12) United States Patent
Sekiba

(10) Patent No.: US 7,956,121 B2
(45) Date of Patent: Jun. 7, 2011

(54) THERMOCONDUCTIVE SILICONE ELASTOMER, THERMOCONDUCTIVE SILICONE ELASTOMER COMPOSITION AND THERMOCONDUCTIVE MEDIUM

(75) Inventor: Kazuhiro Sekiba, Chigasaki (JP)

(73) Assignee: Dow Corning Toray Company, Ltd., Tokyo (JP)

( * ) Notice: Subject to any disclaimer, the term of this patent is extended or adjusted under 35 U.S.C. 154(b) by 449 days.

(21) Appl. No.: 11/574,345

(22) PCT Filed: Aug. 29, 2005

(86) PCT No.: PCT/JP2005/016170
§ 371 (c)(1),
(2), (4) Date: Apr. 27, 2009

(87) PCT Pub. No.: WO2006/025552
PCT Pub. Date: Mar. 9, 2006

(65) Prior Publication Data
US 2009/0275688 A1 Nov. 5, 2009

(30) Foreign Application Priority Data

Aug. 30, 2004 (JP) ................................ 2004-251098
Aug. 19, 2005 (JP) ................................ 2005-238279

(51) Int. Cl.
*C08L 83/04* (2006.01)
*C08K 5/5415* (2006.01)

(52) U.S. Cl. ........ 524/588; 524/268; 524/430; 524/437; 525/477; 525/478; 528/15; 528/31; 528/32

(58) Field of Classification Search .................... None
See application file for complete search history.

(56) References Cited

U.S. PATENT DOCUMENTS

| 4,444,944 | A | | 4/1984 | Matsushita |
| 4,604,424 | A | * | 8/1986 | Cole et al. ............... 524/862 |
| 5,008,307 | A | | 4/1991 | Inomata |
| 5,365,267 | A | * | 11/1994 | Edwards .................. 348/65 |
| 5,801,332 | A | * | 9/1998 | Berger et al. ............. 174/73.1 |
| 7,013,965 | B2 | * | 3/2006 | Zhong et al. ............. 165/185 |
| 2005/0148721 | A1 | * | 7/2005 | Tonapi et al. ............ 524/492 |
| 2009/0275688 | A1 | * | 11/2009 | Sekiba ..................... 524/430 |

FOREIGN PATENT DOCUMENTS

| JP | 56002349 | 1/1981 |
| JP | 2001-011402 | 1/2001 |

OTHER PUBLICATIONS

Standardized test method ASTM D 412-87 (no date).*
Standardized test method JIS K 6251 (no date).*
English language abstract for JP56002349 extracted from espacenet.com, Mar. 7, 2008.
English language translation and abstract for JP2001-011402 extracted from Searching PAJ, Mar. 7, 2008, 28 pages.

* cited by examiner

*Primary Examiner* — Marc S Zimmer
(74) *Attorney, Agent, or Firm* — Howard & Howard Attorneys PLLC

(57) ABSTRACT

A thermoconductive silicone elastomer comprising a silicone elastomer being a cured body of a hydrosilation-curable organopolysiloxane composition, a reinforcement fine silica powder, a thermoconductive inorganic powder, and an alkylphenylpolysiloxane that is liquid at room temperature. A hydrosilation-curable thermoconductive silicone elastomer composition comprising: a hydrosilation-curable organopolysiloxane composition, a reinforcement fine silica powder, a thermoconductive inorganic powder, and an alkylphenylpolysiloxane that is liquid at room temperature. A thermoconductive medium comprising the aforementioned thermoconductive silicone elastomer.

15 Claims, No Drawings

THERMOCONDUCTIVE SILICONE ELASTOMER, THERMOCONDUCTIVE SILICONE ELASTOMER COMPOSITION AND THERMOCONDUCTIVE MEDIUM

RELATED APPLICATIONS

This application claims priority to and all the advantages of International Patent Application No. PCT/JP2005/016170, filed on Aug. 29, 2005, which claims priority to Japanese Patent Application No. JP2004-251098 filed on Aug. 30, 2004 and Japanese Patent Application No. JP2005-238279 filed Aug. 19, 2005.

TECHNICAL FIELD

The present invention relates to a thermoconductive silicone elastomer that, when it is sandwiched in an adhered state between a heat-generating member and a heat-radiating member and is maintained in such a state over a long period of time, can be peeled from the aforementioned members at their respective interfaces with this elastomer, and to a thermoconductive medium comprising the aforementioned thermoconductive silicone elastomer. The present invention also relates to a thermoconductive silicone elastomer composition that is composed of a hydrosilation-curable organopolysiloxane composition, a fine reinforcement silica powder, a thermoconductive inorganic powder, and an alkylphenylsiloxane that is liquid at room temperature.

BACKGROUND ART

In view of recent trends towards miniaturization, increase in density, and improvement in properties of electronic parts that incorporate heat-generating elements and are intended for use in electronic devices, methods of transmitting and dissipating heat from such elements become an important issue. Heretofore, it has been known to fill the space between the aforementioned heat-generating elements and heat-radiating fins or a similar metal chassis with a molded body of a thermoconductive rubber filled with a large amount of alumina or a similar thermoconductive inorganic powder. For example, Japanese Unexamined Patent Application Publication (hereinafter JP Kokai) S56-2349 describes a molded rubber article for heat dissipation.

Since such a molded rubber article is not tacky and has a high hardness of about 54 to 73 measured by a Type A durometer according to JIS K6253, it cannot be easily fixed between a heat-generating element and heat-radiating fins, or a similar metal chassis, and, therefore, assembling of such units is associated with difficulties. Fixation of the unit in an assembled state requires the use of screws and bolt, and this creates problems in case of disassembling and repair. With regard to plasma display panels that recently have found use in personal computers, TV sets, etc., it was proposed to place a grooved heat-radiating adhesive sheet between the plasma display and the heat-generating sheet (see JP Kokai 2001-11402). An adhesive agent mentioned in the above application is a silicone-type adhesive agent, but the adhesive connection between the plasma display and the heat-radiating sheet is permanent, and the unit cannot be disassembled for repair or discarding without breaking it apart, which is inconvenient.

SUMMARY OF THE INVENTION

It is an object of the present invention to provide a thermoconductive elastomer that, when sandwiched between a heat-generating member and a heat-radiating member can be fixed between these members without the use of screws, bolts or other fasteners, can be easily peeled from the aforementioned members, if necessary for repair or disassembling, after being maintained in the sandwiched state over a long period of time. It is another object to provide a thermoconductive silicone elastomer composition for manufacturing the aforementioned silicone elastomer.

The above object is accomplished by means of

[1] A thermoconductive silicone elastomer that has a hardness of 5 to 70 measured by a spring-type hardness tester in accordance with the provisions of SRIS 0101-1968, a tensile strength of no less than 0.2 MPa in accordance with JIS K 6251, a elongation of no less than 300%, and is capable of peeling at interfaces from a heat-generating member and a heat-radiating member after being sandwiched in an adhered state between said members and held in this state for 48 hours at 120° C., the aforementioned thermoconductive silicone elastomer comprising 90 to 10 wt. % of a silicone elastomer being a cured body of a hydrosilation-curable organopolysiloxane composition consisting of (A) an alkylalkenylpolysiloxane having at least two alkenyl groups in one molecule, (B) an alkylhydrogenpolysiloxane having at least two hydrogen atoms in one molecule and (C) a platinum metal type catalyst; (D) 0.2 to 5.0 wt. % of a finely powdered reinforcement silica; (E) 10 to 90 wt. % of a thermoconductive inorganic powder; and (F) 0.1 to 10 wt. % of an alkylphenylpolysiloxane which is liquid at room temperature (100 wt. % total), where components (D), (E) and (F) are dispersed in said silicone elastomer.

[2] The thermoconductive silicone elastomer of Item [1], wherein component (A) is a methylvinylpolysiloxane of the following formula: $(R^1)_3SiO(R_2SiO)_mSi(R^2)_3$ (where R, $R^1$, $R^2$ are methyl or vinyl groups; at least two vinyl groups being present in one molecule; when all R's in one molecule are methyl group, at least one $R^1$ and at least one $R^2$ are vinyl groups; when one R in one molecule is a methyl group, at least one of R' and $R^2$ is a vinyl group; 0.1 to 2% of the total number of methyl groups and vinyl groups of one molecule are vinyl groups; and "m" is a number within the range of 50 to 1,000, and component (B) is a methylhydrogenpolysiloxane selected from the group consisting of a methylhydrogensiloxane·dimethylsiloxane copolymer capped at both molecular terminals with trimethylsiloxy groups, a methylhydrogenpolysiloxane capped at both molecular terminals with dimethylhydrogensiloxy groups, a methylhydrogensiloxane·dimethylsiloxane copolymer capped at both molecular terminals with dimethylhydrogensiloxy groups, tetra(dimethylhydrogensiloxy)silane, and methyltri(dimethylhydrogensiloxy)silane.

[3] The thermoconductive silicone elastomer of Item [2], wherein the methylvinylpolysiloxane is a dimethylpolysiloxane capped at both molecular terminals with dimethylvinylsiloxy groups and having a viscosity within the range of 1,000 to 100,000 mPa·s at 25° C., and component (B) is a dimethylsiloxane·methylhydrogensiloxane copolymer capped at both molecular terminals with trimethylsiloxy groups and having 3 to 5 silicon-bonded hydrogen atoms.

[4] The thermoconductive silicone elastomer of Items [2] or [3], wherein component (D) is a fumed silica; component (E) is an alumina powder or a crystalline silica powder; and component (F) is a methylphenylpolysiloxane of the following formula: $(R^4)_3SiO[(R^3)_2SiO]_nSi(R^4)_3$ (where $R^3$ and $R^4$ are methyl or phenyl groups; 1 to 50% of the total number of methyl groups and phenyl groups in one molecule are phenyl groups; and "n" is a number within the range of 1 to 100).

[5] A hydrosilation-curable thermoconductive silicone elastomer composition comprising: 90 to 10 wt.% of a hydrosilation-curable organopolysiloxane composition consisting of (A) an alkylalkenylpolysiloxane having at least two alkenyl groups in one molecule, (B) an alkylhydrogenpolysiloxane having at least two hydrogen atoms in one molecule, and (C) a platinum metal type catalyst; (D) 0.2 to 5.0 wt.% of a finely powdered reinforcement silica; (E) 10 to 90 wt.% of a thermoconductive inorganic powder; (F) 0.1 to 10 wt.% of an alkylphenylpolysiloxane which is liquid at room temperature (100 wt.% total); said composition, when cured, forming a thermoconductive silicone elastomer that has a hardness of 5 to 70 measured by a spring-type hardness tester in accordance with the provisions of SRIS 0101-1968, a tensile strength of no less than 0.2 MPa in accordance with JIS K 6251, a elongation of no less than 300%, and is capable of peeling at interfaces from a heat-generating member and a heat-radiating member after being sandwiched in an adhered state between said members and held in this state for 48 hours at 120° C.

[6] The The hydrosilation-curable thermoconductive silicone elastomer composition of Item [5], wherein component (A) is a methylvinylpolysiloxane of the following formula: $(R^1)_3SiO(R_2SiO)_mSi(R^2)_3$ (where R, $R^1$, $R^2$ are methyl or vinyl groups; at least two vinyl groups being present in one molecule; when all R's in one molecule are methyl group, at least one $R^1$ and at least one $R^2$ are vinyl groups; when one R in one molecule is a methyl group, at least one of $R^1$ and $R^2$ is a vinyl group; 0.1 to 2% of the total number of methyl groups and vinyl groups of one molecule are vinyl groups; and "m" is a number within the range of 50 to 1,000, and component (B) is a methylhydrogenpolysiloxane selected from the group consisting of a methylhydrogensiloxane·dimethylsiloxane copolymer capped at both molecular terminals with trimethylsiloxy groups, a methylhydrogenpolysiloxane capped at both molecular terminals with dimethylhydrogensiloxy groups, a methylhydrogensiloxane·dimethylsiloxane copolymer capped at both molecular terminals with dimethylhydrogensiloxy groups, tetra(dimethylhydrogensiloxy)silane, and methyltri(dimethylhydrogensiloxy)silane.

[7] The hydrosilation·curable silicone elastomer composition of item [6], wherein the methylvinypolysiloxane is a dimethylpolysiloxane capped at both molecular terminals with dimethylvinylsiloxy groups and having a viscosity within the range of 1,000 to 100,000 mPa·s at 25° C., and component (B) is a dimethylsiloxane·methylhydrogensiloxane copolymer capped at both molecular terminals with trimethylsiloxy groups and having 3 to 5 silicon·bonded hydrogen atoms.

[8] The thermoconductive silicone elastomer composition of Items [6] or [7], wherein component (D) is a fumed silica; component (E) is an alumina powder or a crystalline silica powder; and component (F) is a methylphenylpolysiloxane of the following formula: $(R^4)_3SiO[(R^3)_2SiO]_nSi(R^4)_3$ (where $R^3$ and $R^4$ are methyl or phenyl groups; 1 to 50% of the total number of methyl groups and phenyl groups in one molecule are phenyl groups; <<n>> is a number within the range of 1 to 100).

[9] A thermoconductive medium comprising the thermoconductive silicone elastomer of one of Items [1] to [4].

[10] A thermoconductive medium of Item [9], wherein it is used as a thermoconductive medium between a semiconductor chip and heat-radiating plate, as a thermoconductive medium between a printed circuit board and a heat-radiating plate, as a thermoconductive medium between a plasma display and a heat-radiating plate, or as a thermoconductive element of a DC-DC converter.

Since the thermoconductive silicone elastomer and the thermoconductive medium of the present invention can be easily peeled from a heat-generating member and a heat-radiating member between which it is sandwiched without the use of screws, bolts or other fasteners and kept in such a sandwiched state over a long period of time, the heat-generating member and heat-radiating member that are adhered to each other via the aforementioned thermoconductive silicone elastomer can be easily disassembled and repaired. The effect of the thermoconductive hydrosilation-curable silicone elastomer composition of the present invention consists in that it can be cured, for obtaining the aforementioned thermoconductive silicone elastomer that can be easily peeled from a heat-generating and heat-radiating members between which it is sandwiched without the use of screws, bolts or other fasteners and kept in such a sandwiched state over a long period of time, so that the heat-generating member and heat-radiating member that are adhered to each other via the aforementioned thermoconductive silicone elastomer can be easily disassembled and repaired.

BEST MODE FOR CARRYING OUT THE INVENTION

Alkenyl groups contained in the alkylalkenylpolysiloxane that has in one molecule at least two alkenyl groups and that constitutes component (A) of the hydrosilation-curable organopolysiloxane composition participate in the hydrosilation reaction and are cross-linked with silicon-bonded hydrogen atoms of component (B). The alkylalkenylpolysiloxane may have a linear molecular structure or, to some extent, branched linear molecular structure. It may be in the form of a single polymer, copolymer, or a mixture of two or more polymers.

The silicon-bonded alkyl groups of component (A) may be represented by methyl, ethyl, propyl, butyl, octyl, cyclopentyl, and cyclohexyl groups; and the alkenyl groups can be represented by vinyl, allyl, butenyl, pentenyl, hexenyl, and heptenyl groups. Component (A) may also contain phenyl, tolyl, xylyl, or similar aryl group; benzyl, phenylethyl, or similar aralkyl groups; and 3,3,3,-trifluoropropyl, or similar halogenated alkyl groups, if the content of them in one molecule is less than 5 mole %. The terminal groups are represented by alkyl or aryl groups, but may be represented by methoxy, ethoxy, or similar alkoxy groups and hydroxyl groups. It is recommended that 90 mole % or more in one molecule are methyl groups, and more preferably all silicon-bonded alkyl groups in one molecule are methyl groups. It is recommended that the silicon-bonded alkenyl groups of a molecule are vinyl groups. From the point of view of the silicon elastomer hardness, it is recommended to have in one molecule five or less silicon-bonded alkenyl groups.

A typical example of an alkylalkenylpolysiloxane that contains in one molecule at least two alkenyl groups is a methylvinylpolysiloxane of the following formula: $(R^1)_3SiO(R_2SiO)_mSi(R^2)_3$ (where R, $R^1$, and $R^2$ are methyl or vinyl groups; at least two vinyl groups are present in one molecule; when all R's in one molecule are methyl groups, then at least one $R^1$ and at least one $R^2$ are vinyl groups; when one R in one molecule is a methyl group, at least one of $R^1$ and $R^2$ is a vinyl group; 0.1 to 2% of all methyl and vinyl groups of one molecule are vinyl groups; and "m" is a number within the range of 50 to 1,000).

There are no special restrictions with regard to the viscosity of component (A) at 25° C., provided that it is liquid at room temperature, but from the point of view of better conditions for curing the composition and improved physical properties of a cured body, it is recommended to have the viscosity within the range of 50 to 1,000,000 mPa·s, preferably within the range of 200 to 500,000 mPa·s, and, even more preferably, within the range of 1,000 to 100,000 mPa·s.

Specific examples of aforementioned component (A) are the following: a dimethylpolysiloxane having both molecular terminals capped with dimethylvinylsiloxy groups, a dimethylsiloxane-methylvinylsiloxane copolymer capped at both molecular terminals with trimethylsiloxy groups, a dimethylsiloxane.methylvinylsiloxane copolymer capped at both molecular terminals with dimethylvinylsiloxy groups, and a copolymer of a dimethylsiloxane.methylvinylsiloxane copolymer capped at both molecular terminals with a dimethylethoxysiloxy groups.

Silicon-bonded hydrogen atoms of the alkylhydrogenpolysiloxane (B) that has more than two silicon-bonded hydrogen atoms in one molecule participate in a hydrosilation reaction with alkenyl groups of component (A) and, as a result, cross-links and cures component (A).

It is recommended that component (B) is liquid at room temperature. It may have a linear, branched, or cyclic molecular structure. Examples of the silicon-bonded alkyl groups are the same alkyl groups as given above for component (A), of which methyl groups are preferable. When a molecule of component (A) contains two alkenyl groups, it is recommended to have three or more silicon-bonded hydrogen atoms. When a molecule of component (A) contains three alkenyl groups, it is necessary to have two or more silicon-bonded hydrogen atoms. From the view point of better hardness of the silicone elastomer, it is recommended that the number of the silicon-bonded hydrogen atoms in one molecule does not exceed 5.

From the point of view of tackiness of the silicone elastomer and peelability thereof from heat-generating and heat-radiating members, it is recommended that the mole ratio of silicon-bonded hydrogen atoms of component (B) to alkenyl groups of component (A) is within the range of 3.0 to 0.5, preferably, 2.0 to 0.6, and, even more preferably, 1.5 to 0.7.

The following are specific examples of component (B): a methylhydrogenpolysiloxane capped at both molecular terminals with trimethylsiloxy groups, a methylhydrogensiloxane.dimethylsiloxane copolymer capped at both molecular terminals with trimethylsiloxy groups, a dimethylpolysiloxane capped at both molecular terminals with dimethylhydrogensiloxy groups; a methylhydrogenpolysiloxane capped at both molecular terminals with dimethylhydrogensiloxy groups, a methylhydrogensiloxane.dimethylsiloxane copolymer capped at both molecular terminals with dimethylhydrogensiloxy groups, a cyclic methylhydrogenpolysiloxane, tetra (dimethylhydrogensiloxy) silane, and methyltri (dimethylhydrogensiloxy) silane.

The platinum metal type catalyst (C) is used for accelerating the hydrosilation reaction between alkenyl groups of component (A) and silicon-bonded hydrogen atoms of component (B). Catalyst (C) may be exemplified by a fine platinum metal powder, chloroplatinic acid, a complex of chloroplatinic acid with β-diketone, a complex a chloroplatinic acid with olefin, a complex of a chloroplatinic acid with 1,3-divinyltetramethyldisiloxane, a complex of platinum with 1,3-divinyltetramethyldisiloxane, a thermoplastic silicone resin powder that contains aforementioned catalysts, a rhodium compound, such as those expressed by formulae: $RhCl(Ph_3P)_3$, $RhCl_3[S(C_4H_9)_2]_3$, etc.; tetrakis (triphenyl) palladium, a mixture of palladium black and triphenylphosphine, etc.

According to the present invention, the catalyst has to be added in the amount sufficient for cross-linking components (A) and (B). For example, it can be added in the amount of 0.01 to 500 parts by weight, preferably, 0.1 to 100 parts by weight per $10^6$ parts by weight of the sum of components (A) and (B).

The silicone elastomer being a cured body of a hydrosilation-curable organopolysiloxane composition consisting of (A) an alkylalkenylpolysiloxane having at least two alkenyl groups in one molecule, (B) an alkylhydrogenpolysiloxane having at least two hydrogen atoms in one molecule, and (C) a platinum metal type catalyst, constitutes 90 to 10 wt. %, preferably, 80 to 20 wt. %, of the thermoconductive silicone elastomer of the present invention. The hydrosilation-curable organopolysiloxane composition that consists of (A) an alkylalkenylpolysiloxane having at least two alkenyl groups in one molecule, (B) an alkylhydrogenpolysiloxane having at least two hydrogen atoms in one molecule, and (C) a platinum metal type catalyst constitutes 90 to 10 wt. %, preferably, 80 to 20 wt. % of the aforementioned hydrosilation-curable thermoconductive silicone elastomer composition.

Fine reinforcement silica powder (D) is used for improving viscosity of the (A) and (B) mixture, as well as for improving mechanical strength of the thermoconductive silicone-elastomer. This typically may be fumed silica (dry-process silica or aerosol silica) or precipitated silica (precipitation-process silica). In view of their thickening action, the fumed silica and precipitated silica, and, especially, fumed silica, can be hydrophobized with an organic silicon compound (such as a trimethylchlorosilane, dimethyldichlorosilane, hexamethyldisiloxane, and octamethylcyclotetrasiloxane).

Component (D) is dispersed in the thermoconductive silicone elastomer in an amount of 0.2 to 5 wt. %, and is contained in the hydrosilation-curable thermoconductive silicone elastomer composition, also in a dispersed form, in an amount of 0.2 to 5.0 wt. %, preferably, 0.5 to 3 wt. %.

The thermoconductive inorganic powder (E) imparts thermoconductive properties to the silicone elastomer. This component may be exemplified by an alumina powder, crystalline silica powder, zinc oxide powder, magnesium oxide powder, aluminum nitride, etc. Component (E) may have an average particle size within the range of 1 to 50 μm.

Typical representatives of the alumina powder are an amorphous alumina powder and spherical alumina. The crystalline silica powder can be exemplified by an amorphous crystalline silica powder and a spherical crystalline silica powder.

The amorphous alumina powder is mainly an α-alumina powder obtained by crushing. The spherical alumina powder has an average diameter of particles within the range of 1 to 50 μm. This alumina powder is used mainly in the form of an α-alumina powder obtained by a high-temperature melt spray method or by hydrothermal treatment of an alumina hydrate. In the context of the present patent application, the term "spherical" covers not only strictly spherical shapes, but also substantially spherical particles, i.e., 90% or more of the particles have a shaped factor of 1.0 to 1.4. The aforementioned shape factor is determined according to JIS R 6002 by measuring diameters of 200 particles under a microscope and then calculating an average ratio of the larger diameter to the perpendicular smaller diameter of the particle. In other words, an ideally spherical particle will have the ratio equal to 1.0, and the aforementioned shape factor shows a degree of deviation from 1.0.

Component (E) is contained in the thermoconductive silicone elastomer and in the hydrosilation-curable thermoconductive silicone elastomer composition in a dispersed state. If the content of component (E) in the hydrosilation-curable thermoconductive silicone elastomer composition is too high, the composition becomes very viscous, and if the content of component (E) is too low, it is difficult to obtain a cured body of high thermal conductivity. Therefore, it is recommended to add component (E) to the composition in the amount of 10 to 90 wt. %, preferably 30 to 80 wt. % per total weight of the thermoconductive silicone elastomer composition.

Component (E) may be surface-treated with methyltrimethoxysilane, vinyltrimethoxysilane, dimethyldimethoxysilane, 3-glycidoxypropyltrimethoxysilane, 3-methacryloxypropyltrimethoxysilane, hexamethyldisilazane, or a similar silane-type surface-active agent or an organosiloxane-type surface treatment agent.

The alkylphenylpolysiloxane (F) that is liquid at room temperature is an agent that facilitates separation of the thermoconductive silicone elastomer from the heat-generating member and heat-radiating member between which the elastomer was sandwiched and maintained in a sandwiched state over a long period of time. Alkyl groups of this alkylphenylpolysiloxane are the same as alkyl groups of component (A). Component (F) can typically be represented by the following formula: $(R^4)_3SiO[(R^3)_2SiO]_nSi(R^4)_3$ (where $R^3$ and $R^4$ are methyl or phenyl groups; 1 to 50% of the total number of methyl groups and phenyl groups in one molecule are phenyl groups; "n" is a number within the range of 1 to 100). However, component (F) may also be represented by a branched methylphenylpolysiloxane of the following formula: $(R^3)Si[OSi(R^4)_3]_3$ (where $R^3$ and $R^4$ designate methyl group or phenyl group and where one molecule contains at least one methyl group and at least one phenyl group), or a cyclic methylphenylpolysiloxane.

The following are specific examples of component (F): a methylphenylpolysiloxane capped at both molecular chains with trimethylsiloxy groups, a dimethylsiloxane-methylphenylsiloxane copolymer capped at both molecular terminals with trimethylsiloxy groups, a dimethylpolysiloxane capped at both molecular terminals with dimethylphenylsiloxy groups, a methylphenylpolysiloxane capped at both molecular terminals with dimethylphenylsiloxy groups, a dimethylsiloxane-methylphenylsiloxane copolymer capped at both molecular terminals with dimethylphenylsiloxy groups, a phenyltris (dimethylphenylsiloxy) silane, and methyltri (dimethylphenylsiloxy) silane.

In the hydrosilation-curable thermoconductive silicone elastomer, component (F) should be used in a dispersed state in the amount of 0.1 to 10 wt. %, preferably, 1 to 6 wt. %. In the hydrosilation-curable thermoconductive silicone elastomer composition, component (F) also should be used in the amount of 0.1 to 10 wt. %, preferably, 1 to 6 wt. %.

The hydrosilation-curable thermoconductive silicone elastomer composition of the present invention comprises aforementioned components (A) through (F), but in order to limit thickening at room temperature and to prolong the storage time, the composition may contain hydrosilation-reaction inhibitors, such an alkyne alcohol, enyne compound, benzotriazole, etc. The following are specific examples of such compounds: 3-methyl-1-butyn-3-ol, 3,5-dimethyl-1-hexyn-3-ol, 3-phenyl-1-butyn-3-ol, or similar acetylene-type compounds; 3-methyl-3-penten-1-yne, 3,5-dimethyl-3-hexen-1-yne, or similar enyne compounds; 1,3,5,7-tetramethyl-1,3,5, 7-tetravinyl cyclotetrasiloxane, 1,3,5,7-tetramethyl-1,3,5,7-tetrahexenyl cyclotetrasiloxane, benzotriazole, or similar triazols, phosphines, mercaptanes, and hydrazines. The content of such inhibitors in the hydrosilation-curable thermoconductive silicone elastomer composition may be within the range of 0.001 to 5 wt. %.

Within the limits not detrimental to the objects of the present invention, the thermoconductive silicone elastomer and hydrosilation-curable thermoconductive silicone elastomer composition of the present invention may also incorporate, if necessary, various additives, such as iron oxide, cerium oxide, or similar heat-resistance imparting agents; silane coupling agents, their derivative, or similar adhesion promoters; iron oxide red, carbon black, or other pigments; fumed titanium dioxide, zinc carbonate, aluminum hydroxide, or other flame retardants.

The hydrosilation-curable thermoconductive silicone elastomer composition of the present invention can be easily prepared by uniformly mixing all aforementioned components (A) through (F), if necessary, with other optional components, in a mixer with stirring blades. Alternatively, a mixture can first be prepared by mixing components (A) and (D) with heating, then adding and mixing the product with components (E) and (F), and then compounding the mixture with components (B) and (C). If component (D) is not hydrophobized, in case of heating and premixing this component with component (A), it is recommended to subject component (D) to hydrophobic surface treatment with hydrophobic treatment agents, such as a hexamethyldisiloxane, silanol-end-capped dimethylsiloxane oligomer, silanol-end-capped methylphenylsiloxane oligomer, trimethylsilanol, or the like.

The thermoconductive silicone elastomer of the present invention can be easily produced by holding the aforementioned hydrosilation-curable thermoconductive silicone elastomer composition at room temperature or with heating. Forming may be carried out by pressure molding, extruding, injection molding of the liquid composition, or casting. There are no special restrictions with regard to the shape of the silicone elastomer product that can be made in the form of sheets, tapes, bars, cylinders, blocks, or irregular bodies.

The thermoconductive silicone elastomer of the invention should has a hardness of 5 to 70 measured by a spring-type hardness tester in accordance with the provisions of SRIS 0101-1968, a tensile strength of no less than 0.2 MPa in accordance with JIS K 6251, a elongation of no less than 300%, and should be capable of peeling at interfaces from a heat-generating member and a heat-radiating member after being sandwiched in an adhered state between these members and held in this state for 48 hours at 120° C.

It is recommended that the thermoconductive silicone elastomer of the present invention has a hardness of 5 to 70, preferably, 10 to 65, measured by a spring-type hardness tester which is Asukar-C hardness tester, available from Kobushikeiki Co., Ltd., in accordance with the provisions of SRIS 0101-1968. Since such hardness 70 corresponds to 45 units of a durometer type A hardness according to JIS K6253, the elastomer of the present invention is softer than a conventional silicone rubber, and its hardness holds an intermediate position between silicone rubber and silicone gel.

Furthermore, since the thermoconductive silicone elastomer of the present invention has a tensile strength of no less than 0.2 MPa in accordance with JIS K 6251 and a elongation of no less than 300%, it can be easily formed into a 0.5 to 3 mm thick sheet, tape, bar, cylinder, ring, etc. The thermoconductive elastomer of the present invention is tacky and has shearing adhesive strength measured in accordance with JIS K 6850 with regard to a flat sheet, e.g., an aluminum plate and a glass plate, within the range of 5 to 30 N/cm$^2$, preferably, 7 to 25 N/cm$^2$. Therefore, even though the elastomer can be adhered to a heat-generating member and a heat-radiating member, it also can be easily disconnected from these members. The elastomer of the present invention has thermal conductivity within the range of 0.5 to 3.0 W/m·K.

The thermoconductive silicone elastomer of the present invention can be used as a thermoconductive medium between a semiconductor chip and heat-radiating plate, as a thermoconductive medium between a heat-radiating plate and a printed circuit board that may supports transistors, IC, hybrid IC's, memory elements, or similar heat-generating electronic elements, as a thermoconductive medium between a plasma display and a heat-radiating plate, or as a thermoconductive element of a DC-DC converter. The aforementioned heat-radiating plate may be made from aluminum, duralumin, stainless steel, magnesium alloy, copper, etc. Furthermore, the hydrosilation-curable thermoconductive elastomer composition of the present invention is suitable for the manufacture of the aforementioned thermoconductive silicone elastomer. Such an elastomer can also be formed by curing the composition between heat-generating and heat-radiating members.

EXAMPLES

The present invention is further described in more detail with reference to practical and comparative examples. All characteristics given in the subsequent practical and comparative examples were obtained at 25° C. Tackiness, peelability, hardness, elongation, and thermal conductivity of the thermoconductive silicone elastomers were evaluated by the methods described below.

Tackiness and Peelability of the Thermoconductive Silicone Elastomer

Tackiness was evaluated by placing a 1 mm-thick layer of the hydrosilation-curable thermoconductive silicone elastomer composition between a float plate glass and an aluminum plate (A1050P), and then curing the composition by heating for 30 min. at 100° C. Tackiness of the obtained thermoconductive silicone elastomer was measured in accordance with JIS K 6850 by means of a universal tester Tensilon (RTC-1325A, made by Orientech Co.).

Peelability was evaluated visually by observing whether the thermoconductive silicone elastomer left some material on the surfaces of float plate glass and aluminum plate (A1050P) used in the tackiness evaluation, or if it was completely peeled off from the aforementioned surfaces.

Hardness of the Thermoconductive Silicone Elastomer

The hydrosilation-curable thermoconductive silicone elastomer composition was subjected to pressure vulcanization for 30 min. at 100° C. Two 6-mm thick sheets of the obtained thermoconductive silicone elastomer were stacked, one onto the other, and used for measuring hardness at 1 kg load on a spring-type hardness tester which is Asukar-C hardness tester, available from Kobushikeiki Co., Ltd., in accordance with the procedure of SRIS 0101-1968 for testing physical properties of expanded rubbers.

Tensile Strength and Elongation of the Thermoconductive Silicone Elastomer

The hydrosilation-curable thermoconductive silicone elastomer composition was subjected to pressure vulcanization for 15 min. at 100° C. The obtained 2 mm-thick sheet of the thermoconductive silicone elastomer was used for measuring a tensile strength and elongation on dumbbell No. 4 specimens in accordance with JIS K 6251 on a tensile strength tester ST102-1, available from Ueshima Seisakusho Co., Ltd.

Coefficient of Thermal Conductivity of the Thermoconductive Silicone Elastomer

The hydrosilation-curable thermoconductive silicone elastomer composition was subjected to pressure vulcanization for 30 min. at 100° C. The obtained 15 mm-thick sheet of the thermoconductive silicone elastomer was used for measuring a coefficient of thermal conductivity by means of a Quick Thermal Conductivity Meter, Model QTM-500, available from Kyoto Electronics Manufacturing Co., Ltd.

Practical Example 1

A mixer with stirring blades was loaded with 26.97 wt. % of a dimethylvinylsiloxy-capped dimethylpolysiloxane having a viscosity of 40,000 mPa·s (vinyl group content=0.09 wt. %), 0.98 wt. % of a trimethylsiloxy-capped dimethylsiloxane.methylhydrogensiloxane copolymer having a viscosity of 25 mPa·s and containing on average 3 silicon-bonded hydrogen atoms in the side molecular chains (the content of silicon-bonded hydrogen atoms=0.13 wt. %), 0.15 wt. % of a solution of a platinum-1,3-divinyl-1,1,3,3-tetramethyldisiloxane complex with 0.5 wt. % content of metallic platinum, 0.05 wt. % of an addition reaction inhibitor in the form of 2-phenyl-3-butyn-2-ol, 1.4 wt. % of a fumed silica surface-treated with hexamethyldisilazane having a specific-surface area of 200 m$^2$/g, 67.5 wt. % of an irregular shaped alumina powder with a 11 μm average particle size, and 3.0 wt. % of a trimethylsiloxy-capped methylphenylsiloxane-dimethylsiloxane copolymer having a viscosity of 500 mPa·s (the content of phenyl groups=9.4 wt. %; (phenyl group number is 5% of the total sum of the methyl and phenyl groups). The components were uniformly mixed to produce a hydrosilation-curable thermoconductive silicone elastomer composition. The composition was evaluated with regard to tackiness, peelability, hardness, tensile strength, elongation, and coefficient of thermal conductivity. The results of measurement are shown in Table 1.

Practical Example 2

A mixer with stirring blades was loaded with 28.46 wt. % of a dimethylvinylsiloxy-capped dimethylpolysiloxane having a viscosity of 40,000 mPa·s (vinyl group content=0.09 wt. %), 1.04 wt. % of a trimethylsiloxy-capped dimethylsiloxane.methylhydrogensiloxane copolymer having a viscosity of 25 mPa·s and containing on average 3 silicon-bonded hydrogen atoms in the side molecular chains (the content of silicon-bonded hydrogen atoms=0.13 wt. %), 0.15 wt. % of a solution of a platinum-1,3-divinyl-1,1,3,3-tetramethyldisiloxane complex with 0.5 wt. % content of metallic platinum, 0.05 wt. % of an addition reaction inhibitor in the form of 2-phenyl-3-butyn-2-ol, 1.4 wt. % of a fumed silica surface-treated with hexamethyldisilazane having a specific-surface area of 200 m$^2$/g, 67.5 wt. % of an irregular shaped alumina powder with a 11 μm average particle size, and 1.0 wt. % of a trimethylsiloxy-capped copolymer of a methylphenylsiloxane-dimethylsiloxane copolymer having a viscosity of a 125 mPa·s (the content of phenyl groups=34.2 wt. %; (phenyl group number is 25% of the total sum of the methyl and phenyl groups). The components were uniformly mixed to produce a hydrosilation-curable thermoconductive silicone elastomer composition. The composition was evaluated with regard to tackiness, peelability, hardness, tensile strength, elongation, and coefficient of thermal conductivity. The results of measurement are shown in Table 1.

Practical Example 3

A mixer with stirring blades was loaded with 26.97 wt. % of a dimethylvinylsiloxy-capped dimethylpolysiloxane having a viscosity of 40,000 mPa·s (vinyl group content=0.09 wt/%), 0.98 wt. % of a trimethylsiloxy-capped dimethylsiloxane.methylhydrogensiloxane copolymer having a viscosity of 25 mPa·s and containing on average 3 silicon-bonded hydrogen atoms in the side molecular chains (the content of silicon-bonded hydrogen atoms=0.13 wt. %), 0.15 wt. % of a solution of a platinum-1,3-divinyl-1,1,3,3-tetramethyldisiloxane complex with 0.5 wt. % content of metallic platinum, 0.05 wt. % of an addition reaction inhibitor in the form of 2-phenyl-3-butyn-2-ol, 1.4 wt. % of a fumed silica surface-treated with hexamethyldisilazane having a specific-surface area of 200 m²/g, 67.5 wt. % of an irregular shaped alumina powder with a 11 µm average particle size, and 3.0 wt. % of a trimethylsiloxy-capped methylphenylpolysiloxane having a viscosity of 500 mPa·s (the content of phenyl groups=55.7 wt. %; (phenyl group number is 50% of the total sum of the methyl and phenyl groups). The components were uniformly mixed to produce a hydrosilation-curable thermoconductive silicone elastomer composition. The composition was evaluated with regard to tackiness, peelability, hardness, tensile strength, elongation, and coefficient of thermal conductivity. The results of measurement are shown in Table 1.

Practical Example 4

A mixer with stirring blades was loaded with 26.97 wt. % of a dimethylvinylsiloxy-capped dimethylpolysiloxane having a viscosity of 40000 mPa·s (vinyl group content=0.09 wt. %), 0.98 wt. % of a trimethylsiloxy-capped dimethylsiloxane.methylhydrogensiloxane copolymer having a viscosity of 25 mPa·s and containing on average 3 silicon-bonded hydrogen atoms in the side molecular chains (the content of silicon-bonded hydrogen atoms=0.13 wt. %), 0.15 wt. % of a solution of a platinum-1,3-divinyl-1,1,3,3-tetramethyldisiloxane complex with 0.5 wt. % content of metallic platinum, 0.05 wt. % of an addition reaction inhibitor in the form of 2-phenyl-3-butyn-2-ol, 1.4 wt. % of a fumed silica surface-treated with hexamethyldisilazane having a specific-surface area of 200 m²/g, 67.5 wt. % of an irregular shaped crystalline silica powder with a 18 µm average particle size, and 3.0 wt. % of a trimethylsiloxy-capped methylphenylsiloxane-dimethylsiloxane copolymer having a viscosity of a 125 mPa·s (the content of phenyl groups=9.4 wt. %; (phenyl group number is 5% of the total sum of the methyl and phenyl groups). The components were uniformly mixed to produce a hydrosilation-curable thermoconductive silicone elastomer composition. The composition was evaluated with regard to tackiness, peelability, hardness, tensile strength, elongation, and coefficient of thermal conductivity. The results of measurement are shown in Table 1.

TABLE 1

| Items and Characteristics | | | | Pr. Ex. 1 | Pr. Ex. 2 | Pr. Ex. 3 | Pr. Ex. 4 |
|---|---|---|---|---|---|---|---|
| Tackiness | Glass | Initial | N/cm² | 17 | 15 | 25 | 20 |
| | Aluminum | Initial | N/cm² | 12 | 7 | 13 | 15 |
| Peelability | Glass | Initial | — | Interfacial separation | Interfacial separation | Interfacial separation | Interfacial separation |
| | | After 48 hours at 120° C. | — | Interfacial separation | Interfacial separation | Interfacial separation | Interfacial separation |
| | Aluminum | Initial | | Interfacial separation | Interfacial separation | Interfacial separation | Interfacial separation |
| | | After 48 hours at 120° C. | | Interfacial separation | Interfacial separation | Interfacial separation | Interfacial separation |
| Hardness | | | — | 52 | 50 | 53 | 60 |
| Tensile Strength | | | MPa | 0.9 | 1.0 | 0.9 | 0.5 |
| Elongation | | | % | 850 | 650 | 740 | 350 |
| Coefficient of Thermal Conductivity | | | 0.7 | 0.7 | 0.7 | 0.7 | 0.7 |

Comparative Example 1

A mixer with stirring blades was loaded with 28.40 wt. % of a dimethylvinylsiloxy-capped methylvinylsiloxane-dimethylsiloxane copolymer having a viscosity of 40,000 mPa·s (vinyl group content=0.13 wt. %), 18.91 wt. % of a dimethylvinylsiloxy-capped dimethylpolysiloxane having a viscosity of 10,000 mPa·s (vinyl group content=0.13 wt. %), 1.94 wt. % of a trimethylsiloxy-capped methylhydrogenpolysiloxane having a viscosity of 20 mPa·s (the main molecular chain consists of 23 methylhydrogensiloxane units on average, and the content of silicon-bonded hydrogen atoms=1.55 wt. %), 0.15 wt. % of a solution of a platinum-1,3-divinyl-1,1,3,3-tetramethyldisiloxane complex with 0.5 wt. % content of metallic platinum, 0.03 wt. % of an addition reaction inhibitor in the form of 2-phenyl-3-butyn-2-ol, 11.80 wt. % of a fumed silica surface-treated with hexamethyldisilazane having a specific-surface area of 200 m²/g, 35.50 wt. % of an irregular shaped crystalline silica powder with a 5 µm average particle size, 2.30 wt. % of an irregular shaped alumina powder with a 11 µm average particle size, and 0.97 wt. % of a trimethylsiloxy-capped methyldodecylsiloxane-methyltetradecansiloxane copolymer having a viscosity of 900 mPa·s (the content of dodecyl groups=33.9 wt. %; the content of tetradecan groups=39.5 wt. %; dodecyl group number is 25% of the total sum of the methyl, dodecyl, and tetradecan groups; tetradecan group number is 25% of the total sum of the methyl, dodecyl, and tetradecan groups). The components were uniformly mixed to produce a hydrosilation-curable thermoconductive silicone elastomer composition. The composition was evaluated with regard to tackiness, initial peelability, hardness, tensile strength, elongation, and coefficient of thermal conductivity. The results of measurement are shown in Table 2. This comparative example is based on Practical Example 2 of JP Kokai S56-2349.

Comparative Example 2

A mixer with stirring blades was loaded with 43.75 wt. % of a dimethylvinylsiloxy-capped dimethylpolysiloxane having a viscosity of 3,000 mPa·s (vinyl group content=0.16 wt. %), 1.96 wt. % of a trimethylsiloxy-capped methylhydrogenpolysiloxane having a viscosity of 20 mPa·s (the main molecular chain consists of 23 methylhydrogensiloxane units on average, and the content of silicon-bonded hydrogen atoms=1.55 wt. %), 0.15 wt. % of a solution of a platinum-1,3-divinyl-1,1,3,3-tetramethyldisiloxane complex with 0.5 wt. % content of metallic platinum, 0.03 wt. % of an addition reaction inhibitor in the form of 2-phenyl-3-butyn-2-ol, 1.4 wt. % of a fumed silica surface-treated with hexamethyldisilazane having a specific-surface area of 200 m²/g, 52.33 wt. % of an irregular shaped crystalline silica powder with a 5 μm average particle size, 1.00 wt. % of a titanium oxide powder with a 1 μm average particle size, and 0.78 wt. % of a trimethylsiloxy-capped methylphenylpolysiloxane having a viscosity of 500 mPa·s (the content of phenyl groups=55.7 wt. %; (phenyl group number is 50% of the total sum of the methyl and phenyl groups). The components were uniformly mixed to produce a hydrosilation-curable thermoconductive silicone elastomer composition. The composition was evaluated with regard to tackiness, initial peelability, hardness, tensile strength, elongation, and coefficient of thermal conductivity. The results of measurement are shown in Table 2. This comparative example is based on Practical Example 3 of JP Kokai S56-2349.

Comparative Example 3

A mixer with stirring blades was loaded with 43.75 wt. % of a dimethylvinylsiloxy-capped dimethylpolysiloxane having a viscosity of 3,000 mPa·s (vinyl group content=0.16 wt. %), 1.96 wt. % of a trimethylsiloxy-capped methylhydrogenpolysiloxane having a viscosity of 20 mPa·s (the main molecular chain consists of 23 methylhydrogensiloxane units on average, and the content of silicon-bonded hydrogen atoms=1.55 wt. %), 0.15 wt. % of a solution of a platinum-1,3-divinyl-1,1,3,3-tetramethyldisiloxane complex with 0.5 wt. % content of metallic platinum, 0.03 wt. % of an addition reaction inhibitor in the form of 2-phenyl-3-butyn-2-ol, 52.33 wt. % of an irregular shaped crystalline silica powder with a 5 μm average particle size, 1.00 wt. % of a titanium oxide powder with a 1 μm average particle size, and 0.97 wt. % of a trimethylsiloxy-capped dimethylsiloxane-methyloctylsiloxane copolymer having a viscosity of 20 mPa·s (the content of octyl groups=28.3 wt. %; (octyl group number is 15% of the total sum of the methyl and octyl groups). The components were uniformly mixed to produce a hydrosilation-curable thermoconductive silicone elastomer composition. The composition was evaluated with regard to tackiness, initial peelability, hardness, tensile strength, elongation, and coefficient of thermal conductivity. The results of measurement are shown in Table 2. This comparative example is based on Practical Example 3 of JP Kokai S56-2349.

TABLE 2

| Items and Characteristics | | | Co. Ex. 1 | Co. Ex. 2 | Co. Ex. 3 |
|---|---|---|---|---|---|
| Tackiness | Glass | N/cm² | Fall | 40 | 40 |
| | Aluminum | N/cm² | Fall | 98 | 155 |
| Peelability | Glass | — | Interfacial separation | Cohesive failure | Cohesive failure |
| | Aluminum | — | Interfacial separation | Interfacial separation | Interfacial separation |
| Hardness | | — | 74 | 64 | 62 |
| Tensile Strength | | MPa | 4.8 | 3.3 | 3.1 |
| Elongation | | % | 111 | 176 | 190 |
| Coefficient of Thermal Conductivity | | W/m·K | 0.2 | 0.4 | 0.4 |

Industrial Applicability

The thermoconductive silicone elastomer of the present invention can be used as a thermoconductive medium between a semiconductor chip and heat-radiating plate, as a thermoconductive medium between a heat-radiating plate and a printed circuit board that may supports transistors, IC, hybrid IC's, memory elements, or similar heat-generating electronic elements, as a thermoconductive medium between a plasma display and a heat-radiating plate, or as a thermoconductive element of a DC-DC converter. Furthermore, the hydrosilation-curable thermoconductive elastomer composition of the present invention is suitable for the manufacture of the aforementioned thermoconductive silicone elastomer and thermoconductive medium. The thermoconductive medium of the present invention is useful for heat-releasing or heat-sinking.

The invention claimed is:

1. A thermoconductive silicone elastomer that has a hardness of 5 to 70 measured by a spring-type hardness tester in accordance with the provisions of SRIS 0101-1968, a tensile strength of no less than 0.2 MPa in accordance with JIS K 6251, an elongation of no less than 300%, and is capable of peeling at interfaces from a heat-generating member and a heat-radiating member after being sandwiched in an adhered state between said members and held in this state for 48 hours at 120° C., said thermoconductive silicone elastomer comprising: 90 to 10 wt. % of a silicone elastomer being a cured body of a hydrosilation-curable organopolysiloxane composition consisting of (A) an alkylalkenylpolysiloxane having at least two alkenyl groups in one molecule, (B) an alkylhydrogenpolysiloxane having at least two hydrogen atoms in one molecule, and (C) a platinum metal type catalyst; (D) 0.2 to 5.0 wt. % of a finely powdered reinforcement silica; (E)10 to 90 wt. % of a thermoconductive inorganic powder; and (F) 0.1 to 10 wt. % of an alkylphenylpolysiloxane which is liquid at room temperature (100 wt. % total), where components (D), (E) and (F) are dispersed in said silicone elastomer.

2. The thermoconductive silicone elastomer of claim 1, wherein component (A) is a methylvinylpolysiloxane of the following formula: $R^1{}_3SiO$—$(R_2SiO)_m$—$SIR^2{}_3$ where R, $R^1$, $R^2$ are methyl or vinyl groups; at least two vinyl groups being present in one molecule; when all R' s in one molecule are methyl group, at least one $R^1$ and at least one $R^2$ are vinyl groups; when one R in one molecule is a methyl group, at least one of $R^1$ and $R^2$ is a vinyl group; 0.1 to 2% of the total number of methyl groups and vinyl groups of one molecule are vinyl groups; and "m" is a number within the range of 50 to 1,000, and component (B) is a methylhydrogenpolysiloxane selected from the group consisting of a methylhydrogensiloxane.dimethylsiloxane copolymer capped at both molecular terminals with trimethylsiloxy groups, a dimethylpolysiloxane capped at both molecular terminals with dimethylhydrogensiloxy groups, a methylhydrogensiloxane.dimethylsiloxane copolymer capped at both molecular terminals with dimethylhydrogensiloxy groups, tetra(dimethylhydrogensiloxy)silane, and methyltri(dimethylhydrogensiloxy)silane.

3. The thermoconductive silicone elastomer of claim 2, wherein the methylvinylpolysiloxane is a dimethylpolysiloxane capped at both molecular terminals with dimethylvinylsiloxy groups and having a viscosity within the range of 1,000 to 100,000mPa·s at 25° C., and component (B) is a dimethylsiloxane.methylhydrogensiloxane copolymer capped at both molecular terminals with trimethylsiloxy groups and having 3 to 5 silicon-bonded hydrogen atoms.

4. The thermoconductive silicone elastomer of claim 2, wherein component (D) is a fumed silica; component (E) is an alumina powder or a crystalline silica powder; and component (F) is a methylphenylpolysiloxane of the following formula: $R^4{}_3SiO—(R^3{}_2SiO)_n—SIR^4{}_3$ where $R^3$ and $R^4$ are methyl or phenyl groups; 1 to 50% of the total number of methyl groups and phenyl groups in one molecule are phenyl groups; and "n" is a number within the range of 1 to 100.

5. A hydrosilation-curable thermoconductive silicone elastomer composition comprising: 90 to 10 wt. % of a hydrosilation-curable organopolysiloxane composition consisting of (A) an alkylalkenylpolysiloxane having at least two alkenyl groups in one molecule, (B) an alkylhydrogenpolysiloxane having at least two hydrogen atoms in one molecule, and (C) a platinum metal type catalyst; (D) 0.2 to 5.0 wt. % of a finely powdered reinforcement; (E) 10 to 90 wt. % of a thermoconductive inorganic powder; (F) 0.1 to 10 wt. % of an alkylphenylpolysiloxane which is liquid at room temperature (100 wt. % total); said composition, when cured, forming a thermoconductive silicone elastomer that has a hardness of 5 to 70 measured by a spring-type hardness tester in accordance with the provisions of SRIS 0101-1968, a tensile strength of no less than 0.2 MPa in accordance with JIS K 6251, an elongation of no less than 300%, and is capable of peeling at interfaces from a heat-generating member and a heat-radiating member after being sandwiched in an adhered state between said members and held in this state for 48 hours at 120° C.

6. The hydrosilation-curable thermoconductive silicone elastomer composition of claim 5, wherein component (A) is a methylvinylpolysiloxane of the following formula: $R^1{}_3SiO—(R_2SiO)_m—SIR^2{}_3$ where R, $R^1$, $R^2$ are methyl or vinyl groups; at least two vinyl groups being present in one molecule; when all R's in one molecule are methyl group, at least one $R^1$ and at least one $R^2$ are vinyl groups; when one R in one molecule is a methyl group, at least one of $R^1$ and $R^2$ is a vinyl group; 0.1 to 2% of the total number of methyl groups and vinyl groups of one molecule are vinyl groups; and "m" is a number within the range of 50 to 1,000, and component (B) is a methylhydrogenpolysiloxane selected from the group consisting of a methylhydrogensiloxane.dimethylsiloxane copolymer capped at both molecular terminals with trimethylsiloxy groups, a methylhydrogenpolysiloxane capped at both molecular terminals with dimethylhydrogensiloxy groups, a methylhydrogensiloxane.dimethylsiloxane copolymer capped at both molecular terminals with dimethylhydrogensiloxy groups, tetra(dimethylhydrogensiloxy)silane, and methyltri(dimethylhydrogensiloxy)silane.

7. The hydrosilation-curable thermoconductive silicone elastomer composition of claim 6, wherein the methylvinylpolysiloxane is a dimethylpolysiloxane capped at both molecular terminals with dimethylvinylsiloxy groups and having a viscosity within the range of 1,000 to 100,000 mPa·s at 25° C., and component (B) is a dimethylsiloxane.methylhydrogensiloxane copolymer capped at both molecular terminals with trimethylsiloxy groups and having 3 to 5 silicon-bonded hydrogen atoms.

8. The hydrosilation-curable thermoconductive silicone elastomer composition of claim 6, wherein component (D) is a fumed silica; component (E) is an alumina powder or a crystalline silica powder; and component (F) is a methylphenylpolysiloxane of the following formula: $R^4{}_3SiO—(R^3{}_2SiO)_n—SIR^4{}_3$ where $R^3$ and $R^4$ are methyl or phenyl groups; 1 to 50% of the total number of methyl groups and phenyl groups in one molecule are phenyl groups; and "n" is a number within the range of 1 to 100.

9. A thermoconductive medium comprising the thermoconductive silicone elastomer of claim 1.

10. The thermoconductive medium of claim 9, wherein it is used as a thermoconductive medium between a semiconductor chip and a heat-radiating plate, as a thermoconductive medium between a printed circuit board and a heat-radiating plate, as a thermoconductive medium between a plasma display and a heat-radiating plate, or as a thermoconductive element of a DC-DC converter.

11. The thermoconductive silicone elastomer of claim 3, wherein component (D) is a fumed silica; component (E) is an alumina powder or a crystalline silica powder; and component (F) is a methylphenylpolysiloxane of the following formula: $R^4{}_3SiO—(R^3{}_2SiO)_n—SIR^4{}_3$ where $R^3$ and $R^4$ are methyl or phenyl groups; 1 to 50% of the total number of methyl groups and phenyl groups in one molecule are phenyl groups; and "n" is a number within the range of 1 to 100.

12. The hydrosilation-curable thermoconductive silicone elastomer composition of claim 7, wherein component (D) is a fumed silica; component (E) is an alumina powder or a crystalline silica powder; and component (F) is a methylphenylpolysiloxane of the following formula: $R^4{}_3SiO—(R^3{}_2SiO)_n—SIR^4{}_3$ where $R^3$ and $R^4$ are methyl or phenyl groups; 1 to 50% of the total number of methyl groups and phenyl groups in one molecule are phenyl groups; and "n" is a number within the range of 1 to 100.

13. A thermoconductive medium comprising the thermoconductive silicone elastomer of claim 2.

14. A thermoconductive medium comprising the thermoconductive silicone elastomer of claim 3.

15. A thermoconductive medium comprising the thermoconductive silicone elastomer of claim 4.

* * * * *